United States Patent [19]

Ma et al.

[11] 4,013,485
[45] Mar. 22, 1977

[54] PROCESS FOR ELIMINATING UNDESIRABLE CHARGE CENTERS IN MIS DEVICES

[75] Inventors: Tso-Ping Ma, Mount Kisco; William Hsioh-Lien Ma, Wappingers Falls, both of N.Y.

[73] Assignee: International Business Machines Corporation, Armonk, N.Y.

[22] Filed: Apr. 29, 1976

[21] Appl. No.: 681,368

[52] U.S. Cl. .............................. 148/1.5; 148/186; 29/584
[51] Int. Cl.² .................................... H01L 21/263
[58] Field of Search ............. 148/1.5, 186; 29/578, 29/584

[56] References Cited
UNITED STATES PATENTS 3,533,857   10/1970   Mayer et al. .................. 148/1.5

Primary Examiner—L. Dewayne Rutledge
Assistant Examiner—J. M. Davis
Attorney, Agent, or Firm—David M. Bunnell

[57] ABSTRACT

The electrical properties of MIS semiconductor devices, which have been damaged by radiation, are restored by treating the devices in a properly oriented RF field at low pressure.

7 Claims, 9 Drawing Figures

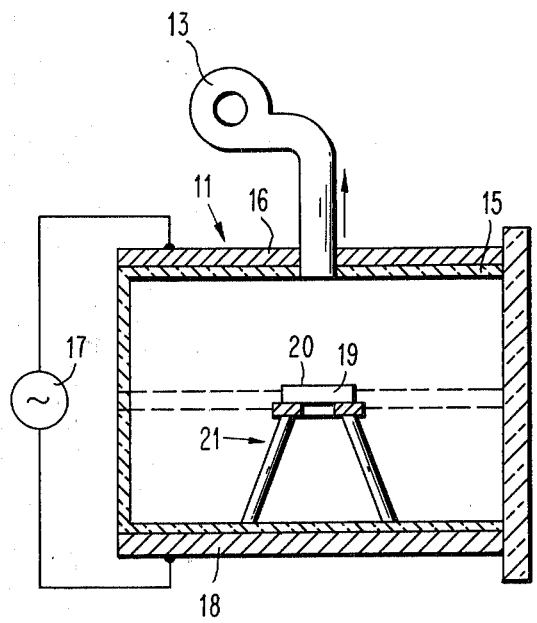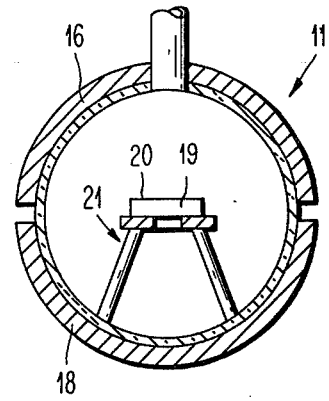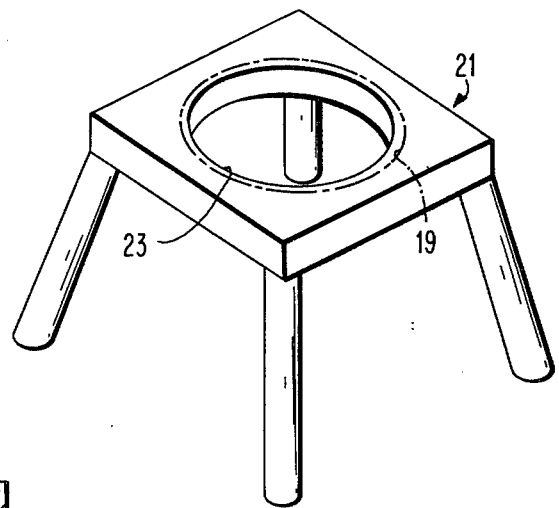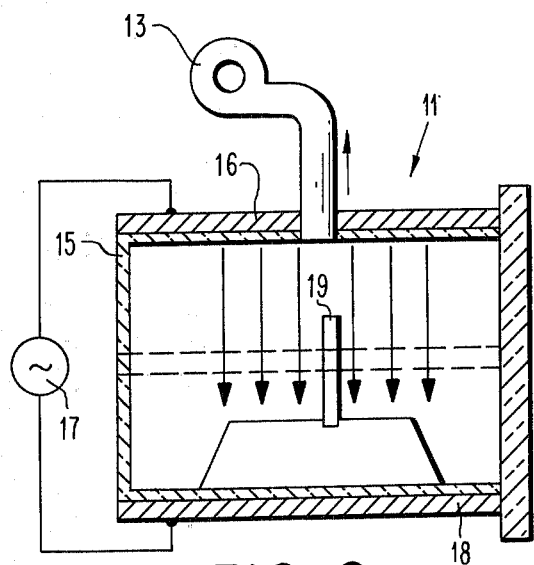
FIG. 1
FIG. 2
FIG. 3
FIG. 6

PROCESS FOR ELIMINATING UNDESIRABLE CHARGE CENTERS IN MIS DEVICES

BACKGROUND OF THE INVENTION

Processing techniques for making integrated circuit semiconductor devices include various steps where the devices are subjected to bombardment by energetic particles such as ions, electrons, and x-rays. Such techniques include, for example, electron beam exposure of resist materials, electron gun metallization, sputter etching, ion implantation, and reactive plasma etching. These techniques cause radiation damage to the semiconductor crystal and insulating layer structure which may result in a deterioration of the electrical properties of the semiconductor devices. Metal-insulator-silicon (MIS) capacitors and field effect transistors are especially sensitive to this type of damage with the formation of fast surface states, slow states, and fixed charges. Heretofore, thermal annealing has been employed to remove the effects of radiation damage. In metal-oxide-semiconductor (MOS) structures, both fast surface states and fixed charge can be removed in about 30 minutes at temperatures of 400° C. In order to anneal out slow states, a higher temperature of about 450° C is sometimes needed. For FET type metal-nitride-oxide-semiconductor (MNOS) structures, even a 60 minute thermal anneal at 450° C may not be sufficient to remove all of the radiation effects generated by electron beam irradiation. Furthermore, the temperature and the time duration of the thermal annealing process may cause damage to both high density FET circuits and shallowly diffused junctions. For thick nitride layer MNOS structures, the thermal annealing process, is usually only partially effective in recovering the electrical properties.

Another annealing method is the photon or ultraviolet annealing technique. In this technique, the irradiated oxide or nitride-oxide film on a semiconductor wafer is illuminated at room temperature under UV light ($\geq$ 4 eV). This technique, however, does not remove fast surface states or slow states and cannot be used after gate metallization.

Radiation annealing has also been used to a lesser extent than the thermal and photon techniques. It has been observed that electron bombardment of slightly negatively biased MIS devices, which were initially bombarded under positive bias, will anneal out the effects of the initial radiation to a certain extent. U.S. Pat. No. 3,533,857 described an ion-irradiation damage crystal restoration technique using a combination of heat and ion-irradiation.

Post oxidation, thermal annealing of thermally grown FET gate oxide using a RF heated susceptor to heat the semiconductor wafers is described in IBM TDB Volume 18, No. 3, page 753 Aug. 1975. This technique maintains cold furnace walls which act to reduce mobile and fixed charges by gettering sodium ions in a neutral or forming gas atmosphere at atmospheric pressure. This process results in heating the wafers to temperatures of 750° to 900° C and, accordingly, could not be used after metallization. It is also believed to be the source of generation of fast surface states.

An annealing technique has now been found which is fast, effective, and which does not require heating the structures to temperatures which would cause physical or chemical damage.

BRIEF SUMMARY OF THE INVENTION

In accordance with this invention a process is provided for restoring the electrical properties of radiation damaged semiconductor structures comprising treating the structures with radio frequency field oriented substantially perpendicular to the structures in a substantially neutral atmosphere at reduced pressure.

DESCRIPTION OF THE DRAWING

FIG. 1 is a highly schematic cross-sectional side view of apparatus suitable for conducting the process of the invention.

FIG. 2 is a highly schematic cross-sectional end view of apparatus suitable for conducting the process of the invention.

FIG. 3 is a isometric view of a wafer holder.

FIG. 6 is a highly schematic cross-sectional side view of a annealing apparatus with the wafer in the resist stripping position.

DETAILED DESCRIPTION

Figure 4:
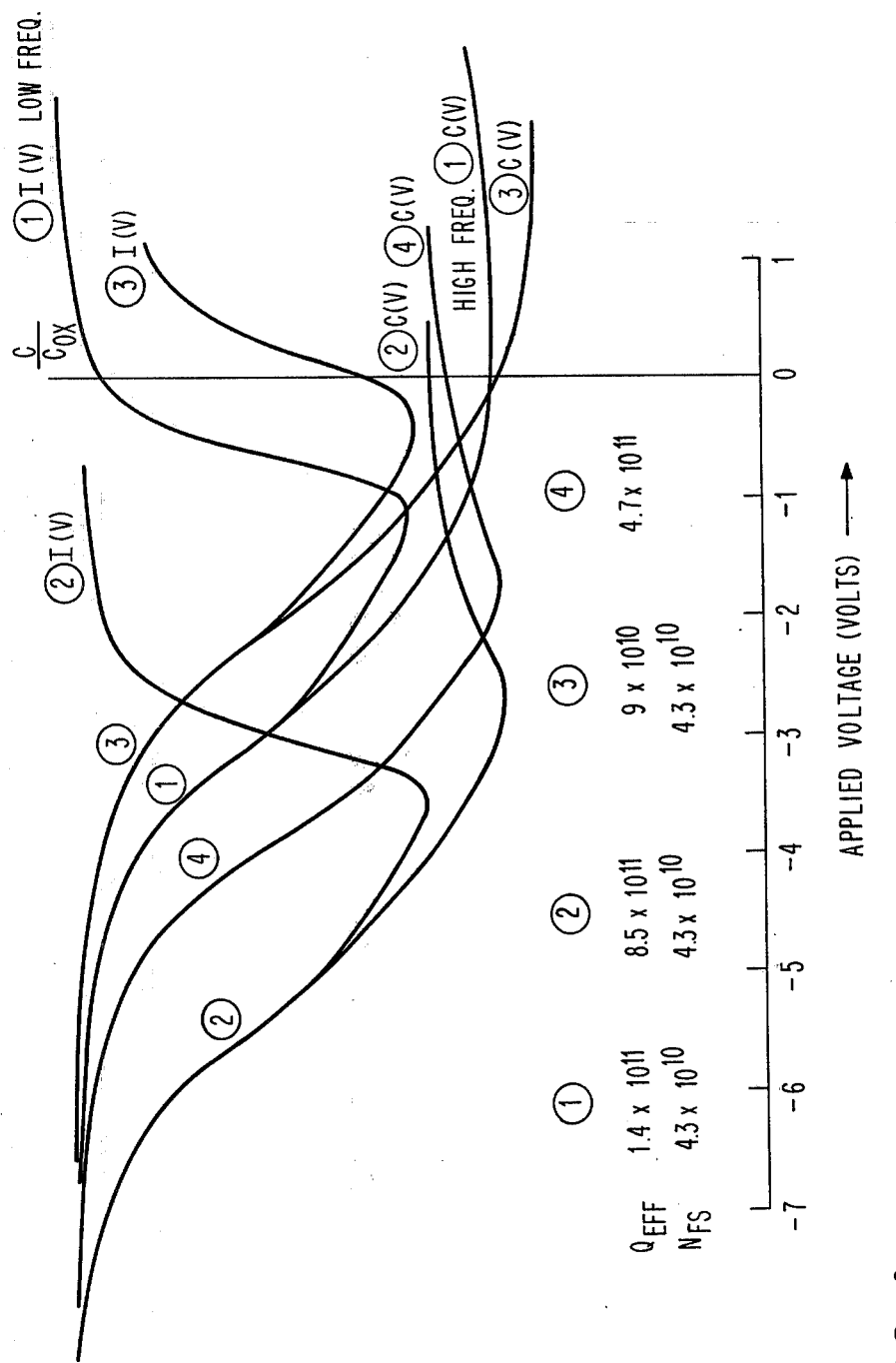
FIG. 4 represents high and low frequency capacitance curves illustrating the improvement in electrical properties achieved by the process of the invention with plasma radiation damaged capacitors.

The annealing process of the invention is accomplished using radio frequency (RF) energy. The mechanism is not fully understood but it is believed to be a combination of electrical and thermal effects. The fact that the technique is effective in restoring the electrical properties of structures of types where thermal annealing is not completely effective, shows the importance of the electrical effects resulting from the radio frequency treatment. Also, the temperatures to which the wafers are heated by the RF field are much lower than normally required for thermal annealing. Exact temperature measurements are difficult to make but results indicate that wafer temperatures remain below about 340° C. Using indicating paints, the wafer temperatures, T, reached in 30 minutes were:

at 200 watts $T < 220°$ C;
at 400 watts $290°$ C $< T < 340°$ C;
at 600 watts $290°$ C $< T < 340°$ C.

This allows the repair of radiation damage while avoiding thermal damage to devices whose structures are temperature sensitive.

Although the examples below were conducted at the federally licensed RF frequency of 13.46 MHz, which falls in about the middle of what is termed the "high frequency range" of 3 to 30 MHz (Webster's Seventh New Collegiate Dictionary, page 705), there is no known reason why other frequencies could not be successfully employed and the invention is not intended to be limited to any particular frequency. For example, experiments have indicated that frequencies in the microwave range can have a beneficial effect in repairing radiation damage.

A preferred radio frequency field is fed to a capacitively coupled apparatus in which the surface of the semiconductor wafer is oriented substantially normal to the direction of the electrical field (FIG. 2). This field is both effective and gives the best uniformity of treatment across the wafer. Orientation of the wafer surface parallel to the field has been found to generate undesirable surface states. Placing the wafer in a field generated by an inductively coupled apparatus has been found to give a beneficial effect, but uniformity of treatment across the wafer may not be achieved in the chamber used.

The process is conducted under low pressures (below about 300 microns) with the preferred pressure being in the order of magnitude of about 10 microns. This can easily be obtained by evacuating the treating chamber with a roughing pump. It has been found that a nitrogen pressure of 300 microns using a 200 to 600 watt power source does not produce a satisfactory annealing effect. This is believed to be due to the dissipation of the energy in the resulting gas plasma. It is presumed that a higher power could overcome this effect and permit somewhat higher pressures to be employed but it is not seen that any benefit would result. Also, the power should be below the point at which sputtering would occur. A substantially neutral residual atmosphere should be employed to avoid any chemical attack by the plasma on the structures. Residual air at 10 microns has not been found to be harmful. In fact, some beneficial effects may result from hydrogen species in the plasma and the release of hydrogen ions from within the dielectric layers of the structures being treated.

The method of supporting the wafer has been found to be important. Placing the wafer on a quartz plate was not effective which may be due to charge buildup upon the plate. Accordingly, it is preferred to support the wafer by its edge in a holder such as illustrated in FIG. 3 as hereinafter described. The exposure of the backside of the wafer to the plasma environment apparently is not critical as it has been found that wafers can be treated batchwise by stacking them on top of one another provided that the edge support wafer holder is employed to support the bottom wafer.

The time needed to complete the annealing is that which is sufficient to achieve recovery of the electrical properties and will vary depending upon the amount of damage and the nature of the structure being treated. Thicker MNOS structures require more time but, generally, about 2 minutes to about 60 minutes is sufficient. RF annealing is, in general, faster than high temperature thermal annealing.

An example of a suitable apparatus for carrying out the process of the invention consists primarily of a standard capacitively coupled plasma etcher 11 and a vacuum pump 13 as illustrated in FIGS. 1 and 2. The vacuum of the quartz annealing chamber 15 is obtained through a 450 L/min, Sargent-Welch Model 1397, 2-stage mechanical roughing pump 13. Chamber base pressure is measured using a MKS Baratron absolute vacuum sensing head Model 310-AL-15-10 in conjunction with a Model 170M-7A signal conditioner and a Model 170M-27A digital read out. Both pump and vacuum sensing head are connected to a Model 2005–1813 International Plasma Corporation etcher/stripper 11. This etcher/stripper basically consists of an 8 inch in diameter by 13 inch long quartz chamber 15 and a 600 watt 13.56 MHz RF power generator 17 which has metal electrodes 16 and 18 around the outside of chamber 15. This system is capable of producing a base pressure of about 10 microns. FIG. 1 shows a cross-sectional view of the annealing chamber with wafer 19, which has devices formed on its surface 20, and annealing wafer holder 21 in place in the chamber. Wafer holder 21 is constructed of quartz and its structure is illustrated in FIG. 3. Wafer 19 whose diameter is slightly larger than the diameter of center hole 23 of wafer holder 21 is placed at the center of the chamber 15. The importance of the wafer holder design was discussed above. After the wafer 19 is placed inside chamber 15 the system is pumped down to rough pump vacuum of about 10 microns. RF power of 200 to 600 watts is then applied to start the annealing process. The electrical field lines are substantially perpendicular to surface 20 of wafer 19 as illustrated by the arrows in FIG. 2. The annealing power and annealing time required, depend upon the type of radiation damage to the material and the layer thicknesses of the semiconductor device structure. After the process is completed, the chamber is back filled to atmospheric pressure and wafer 19 is removed. The power density in the center of the chamber during operation is estimated to be directly proportional to the input power given by the formula $$p = 1.2 \times 10^{-3} \, P \, \text{watt/cm}^2$$

where:
 $p$ = power density
 $P$ = input power in watts.

Thus, a 200 watt input power would give a power density of about 0.24 W/cm$^2$.

The process of the invention is further illustrated, but is not intended to be limited, by the following examples:

EXAMPLE 1

As pointed out above, the RF annealing technique is more effective than the thermal annealing process. To illustrate this, thick nitride MNOS capacitors are used as the vehicle. It is well known that a 400° C thermal annealing process is not very effective on this type of structure. FIG. 4 shows high frequency C(V) and low frequency I(V) curves obtained on thick nitride MNOS (2 ohm-cm P-type (100) silicon wafers with 1600 A nitride, 1000 A oxide, and 20 mil aluminum dots) capacitor structure before, (curve 1) and after oxygen plasma irradiation, (curve 2) and after RF anneal (curve 3). The measurements are made by standard probing techniques and the capacitance measurements represented by the curves have been normalized. The $Q_{eff}$ (fixed charge) and $N_{FS}$ (fast states) of the initial MNOS structure are in the order of $1.4 \times 10^{11}$/cm$^2$ and $4.3 \times 10^{10}$/cm$^2$ respectively. The wafers are coated with a 8000 A thick layer of photoresist which is then removed by stripping in an oxygen plasma. After the oxygen plasma irradiation the C(V) curve is shifted toward the left. This indicates a large amount of fixed charge being generated (no additional fast surface states or slow states are introduced during the plasma treatment for this type of MIS structure). After subjecting a damaged wafer to a 200 watt, 30 minute RF annealing process, at a pressure of about 10 microns in the apparatus illustrated in FIGS. 1 and 2, the undesirable radiation effect is removed as shown by curve 3. Additional RF annealing of the wafer changes neither the C(V) nor the I(V) curve. This indicates that the radiation effect has been neutralized rather than the possibility of compensation by opposite charge injection from the plasma.

FIG. 4 also compares the thermal and RF annealing processes. After oxygen plasma irradiation to remove the photoresist, sample wafers are divided into two groups: One group of wafers is subjected to the thermal annealing process and the other group is subjected to the RF annealing process. C(V) measurements (curve 4) indicate a partial recovery of the fixed charge in MNOS capacitors after a 60 minute 400° C thermal anneal in forming gas. Very little improvement is observed after an additional 2 hour thermal anneal. On the other hand, the 200 watt, 30 minutes RF annealing process described above is sufficient to remove the radiation effects as illustrated in FIG. 4 (curve 3). Excellent uniformity in various MIS capacitors and devices have been achieved as a result of the effectiveness of the RF annealing technique.

EXAMPLE 2

Figure 5:
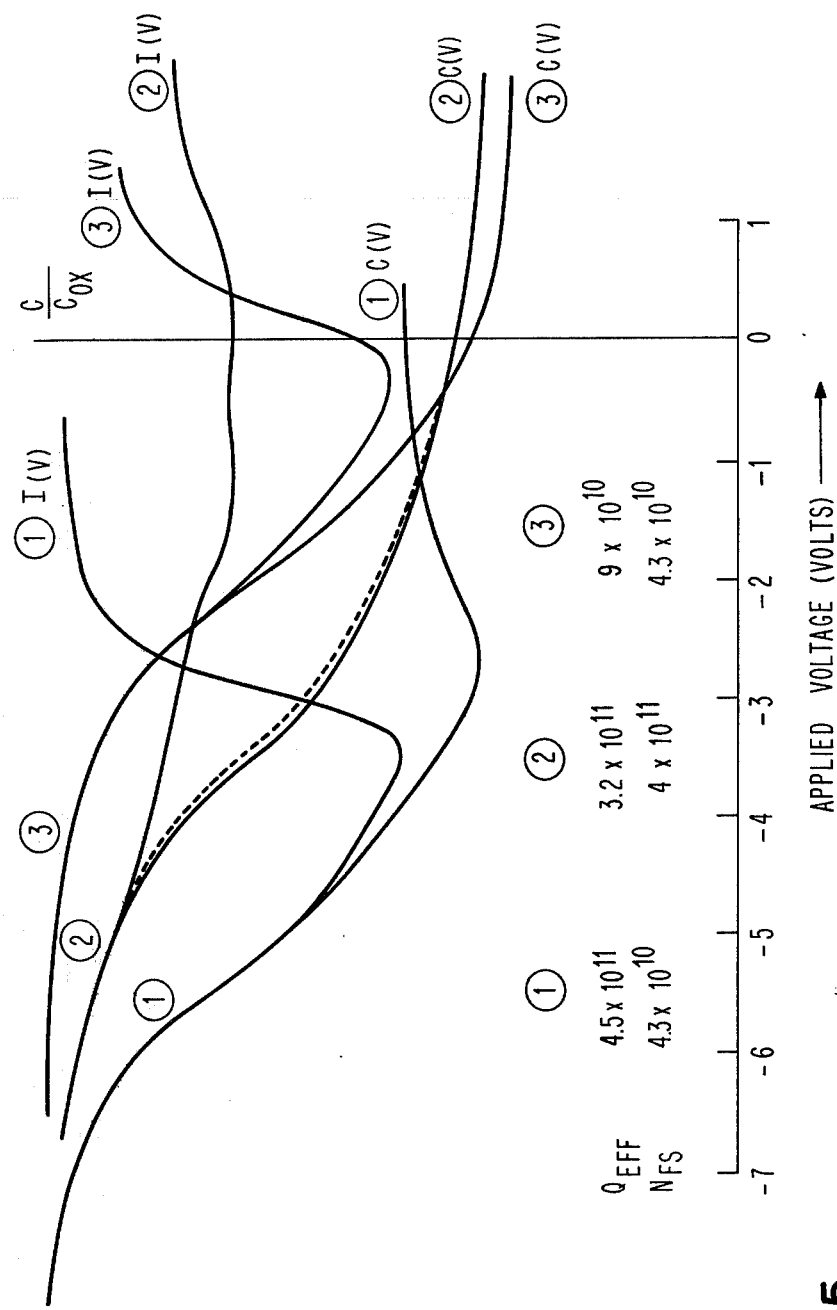
FIG. 5 represents high and low frequency capacitance curves illustrating the effect of wafer positioning on the recovery of the capacitance of MNOS capacitors during RF anneal.

The curves in FIG. 5 show the importance of wafer positioning during the RF annealing process. Thick nitride MNOS containing wafers as in Example 1, which were damaged by plasma stripping of photoresist, are annealed in the stripping position. As illustrated in FIG. 6, wafer 19 with MNOS capacitors formed on surface 20 is supported vertically in chamber 15 so that the electrical field lines represented by the arrows are parallel to surface 20. The power is 200 watts, the time 30 minutes and the pressure about 10 microns. The C(V) and I(V) curves (curve 2) show that while the fixed charge is reduced, additional fast surface states and slow states have been generated. Curves 1 and 3 represent, for comparison purposes, the same data shown in FIG. 5 for the damaged wafer and the RF anneal (curves 2 and 3 respectively). The importance of wafer positioning may be explained as follows; In the stripping position the insulator interface is parallel to the RF field. Thus, the rapidly oscillating field could increase the strain and stress or even break bonds at or near the silicon and silicon-dioxide interface. These undesirable effects are avoided by subjecting the wafer to the RF annealing process in the annealing position. In this position the insulator surface is perpendicular to the RF field. Thus the bonds tend to relax under the oscillation field.

EXAMPLE 3

Figure 7A:
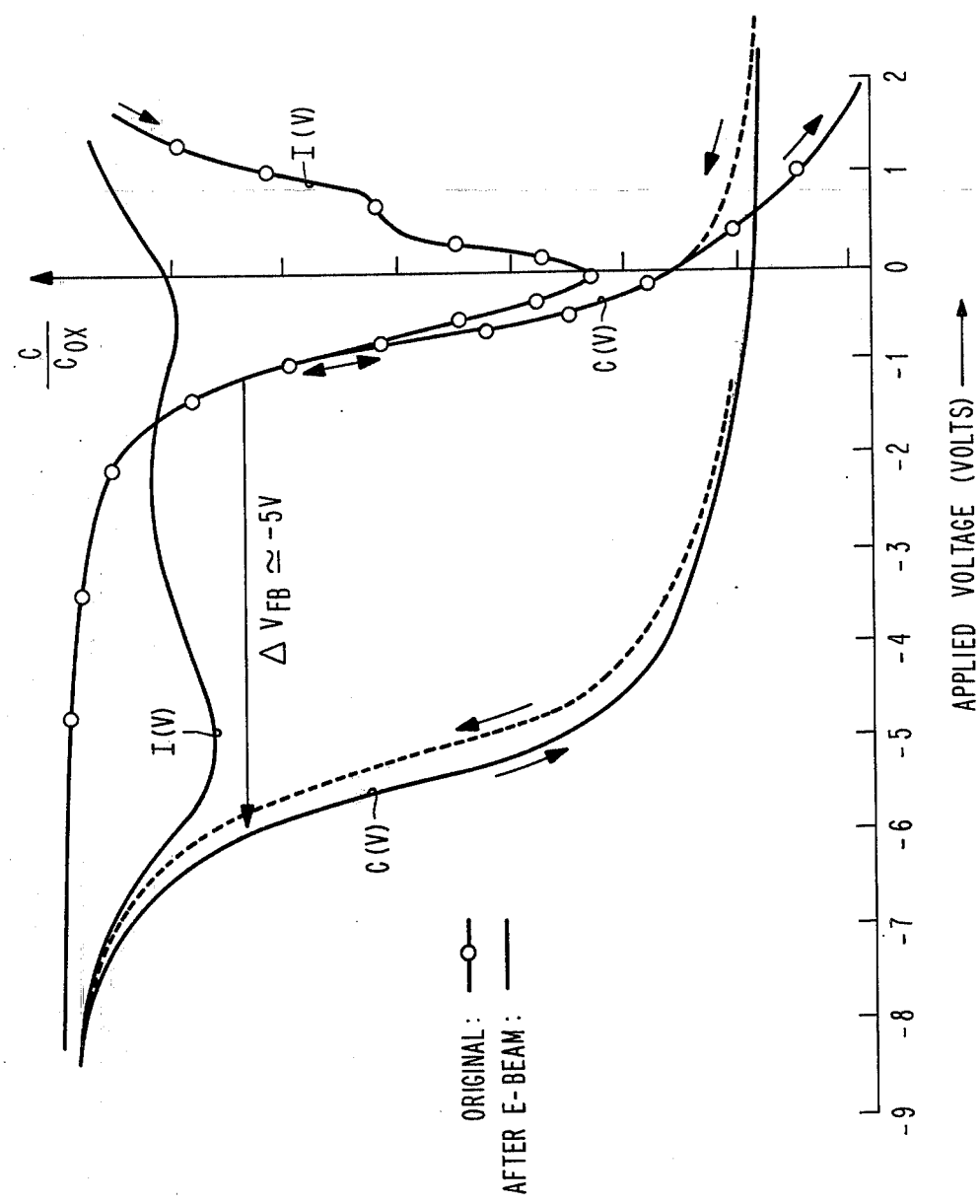
FIG. 7A represents capacitance curves of MNOS capacitors before and after electron beam irradiation.
Figure 7B:
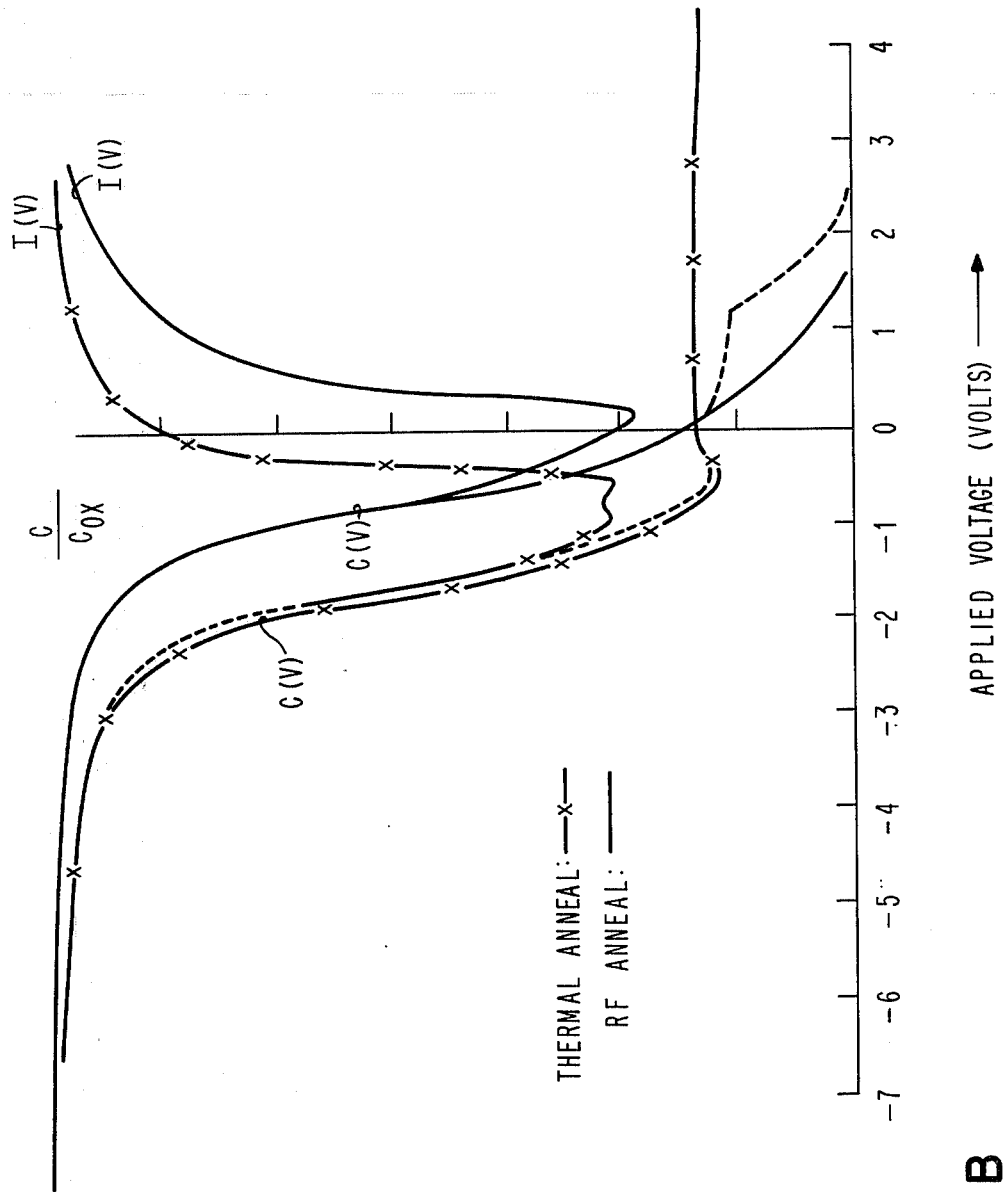
FIG. 7B represents capacitance curves of E-beam damaged MNOS capacitors after thermal and RF annealing.

Silicon wafers, 2 ohm-cm P-type (100) having MNOS FETs and MNOS capacitors formed thereon with a gate insulator of 300 A/300 A, $Si_3N_4/SiO_2$, are subjected to electron beam radiation. A 25 KeV electron beam is used to expose each wafer to a dosage of $1.6 \times 10^{-5}$ coulombs/cm$^2$. Prior to the irradiation, device parameters of threshold voltage $V_T$ and normalized transconductance are determined for 8 FETs and C(V) and I(V) curves for one capacitor at each chip site throughout the wafer. One FET has a channel length of 0.65 mil and the rest have channel lengths of 0.15 mil. The same parameters are measured after the electron beam irradiation. The curve in FIG. 7A illustrates typical results for electron beam damaged electron beam capacitors. The sample wafer is placed in the annealing chamber in annealing position at 10 microns pressure and 600 watts power for 60 minutes. When the radio frequency field is started, a plasma forms in the chamber. Other sample wafers are subjected to thermal anneal in 400° F for 60 minutes in forming gas. The results of the capacitance values are shown in FIG. 7B. The curves indicate that although both the thermal and the RF anneal removed surface states as shown by the I(V) curves only the RF anneal removes the fixed charge as illustrated by C(V) curves. The dotted lines result from voltage measurements returning from right to left. The difference from the initial curve is due to the existance of slow states.

Figure 8:
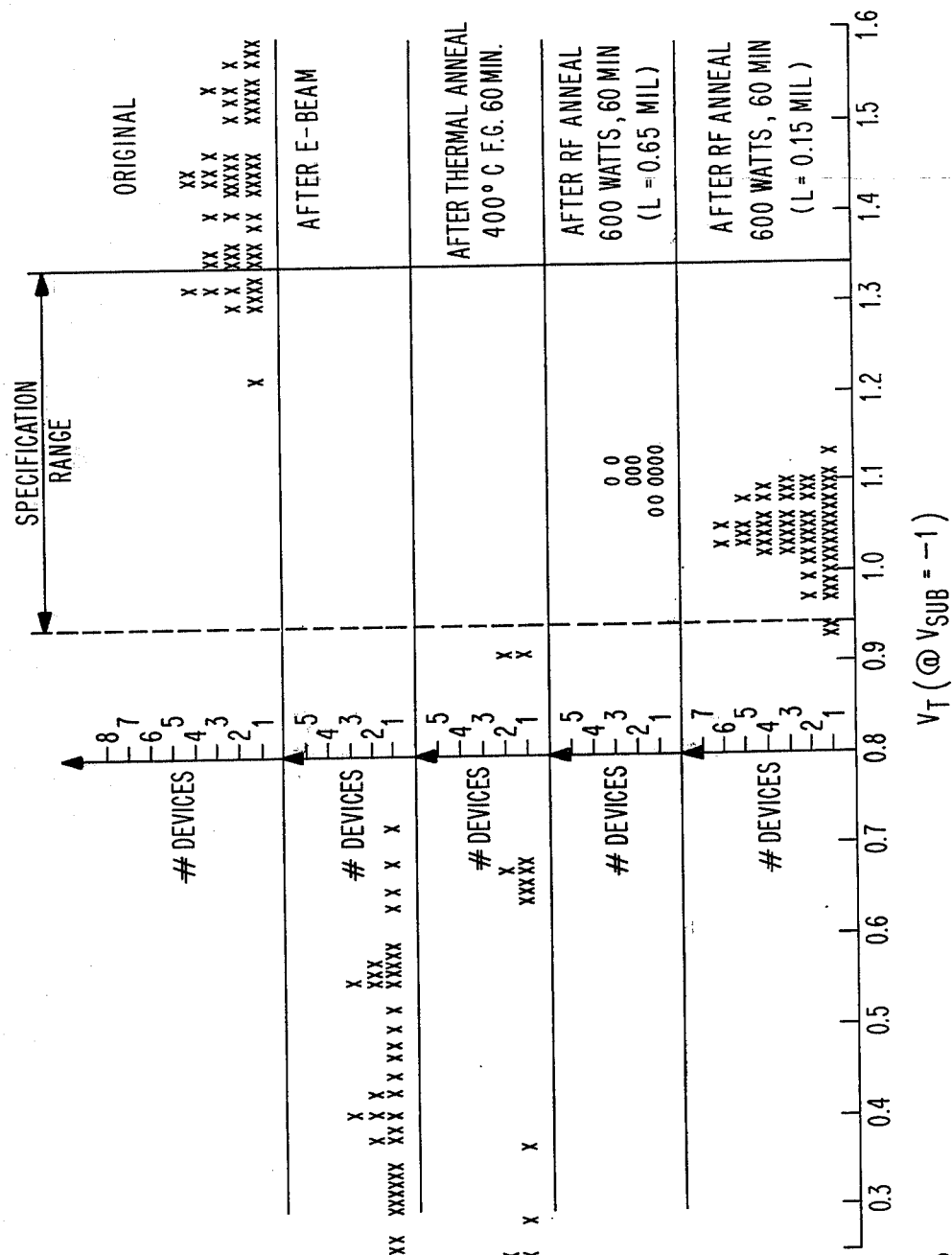
FIG. 8 is a chart illustrating the beneficial effects achieved by treating E-beam damaged MNOS FET device wafers according to the process of the invention.

The chart of FIG. 8 shows the changes in threshold voltages $V_T$ and the range of distribution of voltages between the various FETs tested with each X representing the $V_T$ for a transistor. The original threshold voltages are noted to be largely above the specified range. This is due to the excess surface states initially at the interface. Thermal anneal was found to bring the voltages down into the specification range. After electron beam radiation, values are all below specification and there is a wide distribution of $V_T$. The thermal annealing at 400° C for 60 minutes in forming gas fails to bring the devices back into specification. RF anneal at 600 watts power for 60 minutes at 10 microns pressure, on the other hand, brought both the 0.65 and 0.15 channel length devices back into specification with respect to threshold voltage. Both thermal and RF anneal were successful in bringing the transconductance values into specification.

As illustrated in the above examples, the process of the invention successfully anneals out damage in various electron beam and oxygen plasma irradiated MIS capacitors. In addition it also successfully recovers both threshold voltages and transconductances on various E-beam fabricated and irradiated MNOS FET devices. After the RF annealing process, dielectric breakdown strength, short term bias-temperature stability, and hot electron effect in MIS capacitors have been examined with no degradation being observed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process for restoring the electrical properties of radiation damaged semiconductor structures comprising treating the structures with a radio frequency field which is oriented substantially perpendicular to the structures in a substantially neutral atmosphere at reduced pressure.

2. The process of claim 1 which employs a capacitively coupled RF field with a frequency in the range of about 3 to 30 MHz with a power source of 200 to 600 watts and the pressure is below about 300 microns.

3. A process for restoring the electrical properties of radiation damaged MIS structures formed on the surface of a silicon wafer comprising supporting said wafer by its edge in a chamber, reducing the pressure in said chamber to below about 300 microns, applying a capacitively coupled RF field to said chamber such that the electrical field direction is oriented substantially perpendicular to the surface of said wafer, for a time sufficient to restore the electrical properties of said MIS structures, removing said field and restoring said chamber to atmospheric pressure, and removing said wafer from said chamber.

4. The process of claim 3 wherein the pressure is about 10 microns, the frequency is in the range from about 3 to 30 MHz with a power source of about 200 to 600 watts, the time is from about 2 to 60 minutes and the heating effect of the RF field on the wafer does not heat the wafer to a temperature above about 340° C during the process.

5. The process of claim 4 wherein the MIS structures are aluminum-silicon nitride-silicon oxide-silicon capacitors and field effect transistors.

6. The process of claim 4 wherein the MIS structures are aluminum-silicon oxide-silicon capacitors and field effect transistors.

7. The process of claim 4 wherein the frequency is 13.46 MHz.

* * * * *